(12) United States Patent
Shaheen et al.

(10) Patent No.: US 8,535,996 B2
(45) Date of Patent: Sep. 17, 2013

(54) SUBSTRATE HAVING A CHARGED ZONE IN AN INSULATING BURIED LAYER

(75) Inventors: Mohamad Shaheen, Portland, OR (US); Frederic Allibert, Grenoble (FR); Gweltaz Gaudin, Grenoble (FR); Fabrice Lallement, Aix les Bains (FR); Didier Landru, Champ Pres Froges (FR); Karin Landry, Grenoble (FR); Carlos Mazure, Bernin (FR)

(73) Assignee: SOITEC, Bernin (FR)

( * ) Notice: Subject to any disclaimer, the term of this patent is extended or adjusted under 35 U.S.C. 154(b) by 395 days.

(21) Appl. No.: 12/865,838

(22) PCT Filed: Mar. 13, 2008

(86) PCT No.: PCT/IB2008/052203
§ 371 (c)(1),
(2), (4) Date: Aug. 2, 2010

(87) PCT Pub. No.: WO2009/112894
PCT Pub. Date: Sep. 17, 2009

(65) Prior Publication Data
US 2011/0012200 A1 Jan. 20, 2011

(51) Int. Cl.
*H01L 21/84* (2006.01)

(52) U.S. Cl.
USPC ........... 438/164; 438/412; 257/347; 257/354; 257/E21.7; 257/E21.702; 257/E21.704

(58) Field of Classification Search
USPC .............. 257/347, 353, 354, 618, 623, E21.7, 257/E21.702, E21.703, E21.704; 438/164, 438/412
See application file for complete search history.

(56) References Cited

U.S. PATENT DOCUMENTS

| | | | |
|---|---|---|---|
| 5,227,313 A | 7/1993 | Gluck et al. | |
| 5,231,045 A | 7/1993 | Miura et al. | |
| 5,244,817 A | 9/1993 | Hawkins | |
| 5,374,564 A | 12/1994 | Bruel et al. | |
| 7,071,061 B1 * | 7/2006 | Pittikoun | 438/267 |
| 7,592,682 B2 | 9/2009 | Kishima | |
| 7,692,963 B2 | 4/2010 | Shino et al. | |
| 7,858,494 B2 | 12/2010 | Endo et al. | |
| 7,977,740 B2 * | 7/2011 | Hebert et al. | 257/330 |
| 2005/0269640 A1 * | 12/2005 | Shimamoto et al. | 257/351 |
| 2006/0166451 A1 | 7/2006 | Raskin et al. | |
| 2007/0012988 A1 | 1/2007 | Bhattacharyya | |

(Continued)

FOREIGN PATENT DOCUMENTS

| | | |
|---|---|---|
| JP | 2003152192 A | 5/2003 |
| JP | 2007149790 A | 6/2007 |

(Continued)

OTHER PUBLICATIONS

KR Office Action for KR Application No. 10-2010-7017903 dated Jan. 13, 2012, 7 pages.

(Continued)

*Primary Examiner* — Eduardo A Rodela
(74) *Attorney, Agent, or Firm* — TraskBritt

(57) ABSTRACT

Embodiments of the invention relate to substrates comprising a base wafer, an insulating layer and a top semiconductor layer, wherein the insulating layer comprises at least a zone wherein a density of charges is in absolute value higher than $10^{10}$ charges/cm$^2$. The invention also relates to processes for making such substrates.

11 Claims, 2 Drawing Sheets

(56) References Cited

U.S. PATENT DOCUMENTS

| | | |
|---|---|---|
| 2007/0114630 A1 | 5/2007 | Kishima |
| 2007/0173033 A1 | 7/2007 | Allibert |
| 2008/0128810 A1* | 6/2008 | Iwamatsu et al. .............. 257/347 |
| 2008/0239789 A1* | 10/2008 | Shino et al. ................... 365/149 |
| 2009/0212363 A1* | 8/2009 | Krivokapic ................... 257/347 |
| 2012/0161226 A1* | 6/2012 | Darwish ........................ 257/330 |

FOREIGN PATENT DOCUMENTS

| | | |
|---|---|---|
| JP | 2008098467 A | 4/2008 |
| JP | 2008124209 A | 5/2008 |
| KR | 1020040024636 A | 3/2004 |
| WO | 2007011582 A2 | 1/2007 |

OTHER PUBLICATIONS

Francois-Saint-Cyr, H.G., et al., "Diffusion of 18 elements implanted into thermally grown SiO2," Journal of Applied Physics, vol. 94, No. 12, Dec. 15, 2003, pp. 7433-7439.

International Search Report, International Application No. PCT/IB2008/052203, mailed Dec. 1, 2008, 3 pages.

International Written Opinion of the International Searching Authority, International Application No. PCT/IB2008/052203, mailed Dec. 1, 2008, 6 pages.

* cited by examiner

US 8,535,996 B2

SUBSTRATE HAVING A CHARGED ZONE IN AN INSULATING BURIED LAYER

CROSS-REFERENCE TO RELATED APPLICATION

This is a national phase entry under 35 U.S.C. §371 of International Patent Application PCT/IB2008/052203, filed Mar. 13, 2008, published in English as International Patent Publication WO 2009/112894 A1 on Sep. 17, 2009, the entire disclosure of which application is hereby incorporated herein by this reference.

TECHNICAL FIELD

The invention relates to a substrate comprising a base wafer, an insulating layer and a top semiconductor layer, that can be used in electronic devices, notably in memories.

BACKGROUND

DRAM memory is typically made of one transistor and one capacitor cell (1T1C). While the transistor functions as pass, the capacitor is used for charge storage. The capacitor can be either a trench configuration or a stacked capacitor. A certain novel class of DRAM memories can be comprised of only one transistor, without the need for a capacitor, and hence is referred to as capacitorless DRAM, 1T, or 1T-RAM. Such memory types are usually based on Semiconductor-on-Insulator (SeOI)-like substrates, where the transistor, through its floating body characteristics, acts as both control transitory and charge storage device. Examples of such type are the "Floating Body Cell" (FBC), or the "zero-capacitor RAM" (zRAM) though other variations exist.

A typical 1T memory is illustrated in FIG. 1.

The SeOI substrate comprises from its base to its top a base wafer 10, an insulating layer 20 and a top semiconductor layer 30, also called a "useful layer."

The memory device is made of transistors made on the semiconductor useful layer 30. The source S and drain D are made in the useful layer 30, whereas the gate G is deposited on an insulating layer on the useful layer 30.

For a certain class of 1T memory that requires back-bias, such as the FBC, an electrode E is also installed on the rear side of the substrate, i.e., on the base wafer 10.

During operation of the 1T memory, charges (holes) are injected from the channel near the drain region via impact ionization into the body of the transistor. The presence of these positive charges shifts the Vt of the transistor lower and changes the current-voltage characteristics. This shift is used to detect or "read" the state of the cell, being either "1" or "0."

1T memory being a volatile memory, a periodic refresh is carried out in order to restore charge, and hence programming state, to the transistor. Charge is mainly lost through various leakage mechanisms, and the rate of charge loss determines the retention time of the memory cell. If such time is short, extensive refreshing is needed resulting in high power consumption and poor yield. Therefore, it is highly desirable to extend the retention time of the cell, i.e., charge retention in the transistor as much as practical. To that end, a rear electrode E can be used to apply a negative voltage in order to keep the charges in the transistor body as long as possible, e.g., near a back interface in the 1T design.

However, the installation of the rear electrode E requires additional processing and complex circuits that makes it expensive.

There is thus a need for a SeOI-like substrate that allows increasing the retention time of the 1T memories, at a lower cost.

BRIEF SUMMARY

A first object of the invention is a substrate comprising successively a base wafer, an insulating layer and a top semiconductor layer, characterized in that the insulating layer comprises at least a zone wherein the density of charges is in absolute value higher than $10^{10}$ charges/cm$^2$.

"Zone" is meant here either as the whole insulating layer itself, or a layer forming part of the insulating layer, or discrete islands embedded in the insulating layer.

According to a first embodiment of the invention, the insulating layer is made of a material chosen among the group consisting of silicon oxide, silicon nitride or high-k materials.

According to a second embodiment, the insulating layer comprises a charge-confining layer between two diffusion barrier layers, wherein the charge-confining layer has a density of charges in absolute value higher than $10^{10}$ charges/cm$^2$. Preferably, the charge-confining layer is made of silicon nitride and the diffusion barrier layers are made of silicon oxide. Alternatively, the charge-confining layer is made of silicon oxide and the diffusion barrier layers are made of silicon nitride.

According to a third embodiment of the invention, the insulating layer comprises charge-trapping islands, wherein the charge-trapping islands have a total density of charges in absolute value higher than $10^{10}$ charges/cm$^2$. The insulating layer is advantageously made of silicon oxide and the charge-trapping islands are made of silicon.

The charges comprised in the insulating layer are preferably at least partially provided by ions. A first possibility is that the density of charges is negative and the ions are chosen among the group consisting of fluorine and chlorine ions. A second possibility is that the density of charges is positive and the ions are chosen among the group consisting of boron and phosphor ions.

A second object of the invention is a semiconductor structure comprising a 1TRAM memory, comprising a floating body region on an insulating layer, wherein the insulating layer comprises a zone exhibiting a density of charges in absolute value higher than $10^{10}$ charges/cm$^2$.

A third object of the invention relates to a process for manufacturing a substrate comprising successively a base wafer, an insulating layer and a top semiconductor layer, characterized in that it includes the step of charging at least a zone of the insulating layer so that the zone exhibits a density of charges in absolute value higher than $10^{10}$ charges/cm$^2$.

According to a first embodiment of the process, the charging step comprises doping the insulating layer.

According to another embodiment, the charging step comprises implanting ions in the insulating layer through the top semiconductor layer.

Alternatively, the process comprises the steps of:
  forming the insulating layer on the base wafer or on a donor wafer;
  bonding the base wafer and the donor wafer, the insulating layer being at an interface; and the charging step is carried out before the bonding step.

The charging step may comprise an electron bombardment of the insulating layer, or a plasma treatment of the insulating layer.

Alternatively, the step of forming the insulating layer comprises forming a first diffusion barrier layer, a charge-confining layer and a second diffusion barrier layer.

The charging step can comprise a plasma activation of the charge-confining layer.

In a variant, the charging step comprises growing a doped charge-confining layer, wherein the dopant is chosen among the group consisting of boron, phosphor, chlorine and fluorine, and the concentration of the dopant is higher than $10^{10}/cm^2$.

The charge-confining layer is preferably made of silicon nitride and the diffusion barrier layers are made of silicon oxide.

According to another embodiment of the invention, the process comprises, prior to the bonding step, forming charge-trapping islands in the insulating layer. For instance, the charge-trapping islands are made of silicon.

A fourth object of the invention is a process for charging the insulating layer of a substrate comprising successively a base substrate, an insulating layer and a top semiconductor layer, characterized in that the insulating layer comprises atomic species with a density higher than $10^{10}$ atoms/cm$^2$, wherein the atomic species are able to change into ions under injection of charged carriers into the insulating layer.

BRIEF DESCRIPTION OF THE DRAWINGS

Other characteristics, objects, and advantages of the invention will appear clearer in reading the description below, which is illustrated by the following figures.

DETAILED DESCRIPTION

The general idea of the invention is to replace a rear electrode with a charge located in an SeOI-like structure, under an interface between a useful layer and an insulating layer. A negatively charged insulating layer plays the same role as the rear electrode, i.e., creating a negative voltage in the SeOI structure for retaining the holes near the insulating layer.

Conversely, a positively charged insulating layer is able to retain electrons, in certain types of 1TRAM, which utilize PMOS transistors and hence electron charge.

Standard Structure

A standard substrate of the SeOI type is provided. Such a structure comprises a base wafer 1, an insulating layer 2 and a top layer 3.

The base wafer 1 can made of a bulk or composite material.

The insulating layer 2 is made of a material having electrically insulating properties. "Insulating layer" is meant in this text as a single layer or a stack of different materials having dielectric properties.

The insulating layer 2 is usually an oxide, such as silicon oxide ($SiO_2$). In this case, it is usually called "BOX" (Buried Oxide layer).

The insulating layer 2 can also made of silicon nitride, an oxide-nitride combination, or of a "high-k" material, such as hafnium oxide.

The thickness of the insulating layer is typically between 10 and 5000 angstroms.

The top semiconductor layer 3, also called "useful" or "active" layer, is made of a semiconductor material, such as silicon.

Such a SeOI substrate can be made by a SMART CUT® process, or by any other possible process.

The SMART CUT® process is described in detail in U.S. Pat. No. 5,374,564.

Figure 1:
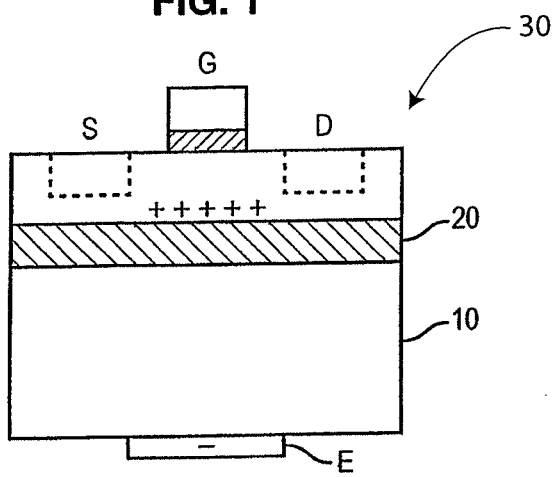
FIG. 1 shows a 1T memory according to the prior art.
Figure 2:
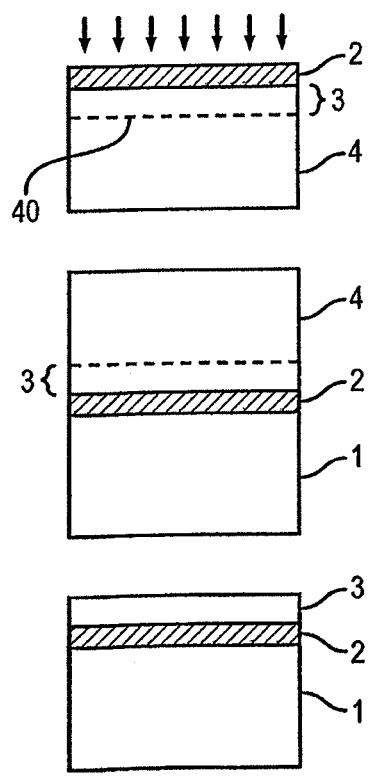
FIG. 2 illustrates the steps for making a SeOI substrate with the SMART CUT® process.

Referring to FIG. 2, it typically comprises the following steps:

a) Providing a base wafer 1 and a donor wafer 4 made of a semiconductor material;

b) Oxidizing one or both of the wafers—preferably the donor wafer 4, thus creating the insulating layer 2 on the donor wafer 4;

c) Implanting ions in the donor wafer 4 in order to create a weakness zone 40 at a depth corresponding to the thickness of the active layer 3;

d) Bonding the donor wafer 4 to the base wafer 1 with the insulating layer 2 at the interface; and e) Splitting the donor wafer 4 according to the weakness zone 40, thus, transferring the top layer 3 to the base wafer 1.

The insulating layer 2 has a density of charges in absolute value higher than $10^{10}$ charges/cm$^2$, for example, higher than $10^{11}$ charges/cm$^2$.

This charge can be measured using a pseudo-MOS technique or mercury-FET measurement.

The density of charges is positive when the charges are positive (such as holes); the density of charges is negative when the charges are negative (such as electrons).

It must be noted that the buried oxide layer in a conventional SeOI-like substrate is usually slightly charged but this charge is minimized in order to avoid electrical losses in the base wafer, as explained, for example, in application US 2006/0166451.

In the following description, it is assumed that the charges that have to be retained near the insulating layer are holes (i.e., positive) and thus that the insulating layer has to be negatively charged. Other retention modes such as in the transistor body or near the top channel can benefit from a similar approach.

However, the invention applies conversely to the problem of retaining electrons near the insulating layer using a positively charged insulating layer.

FIRST EMBODIMENT

Charged BOX Layer

In this embodiment, the charged zone is the insulating layer itself.

The insulating layer 2 is preferably made of silicon oxide: it can thus be called "BOX."

Figure 3:
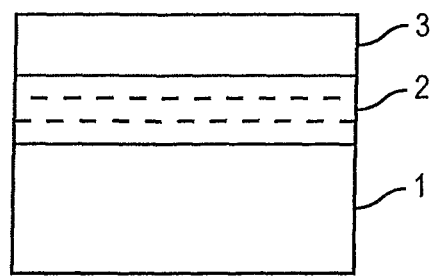
FIG. 3 illustrates a first embodiment of the SeOI-like substrate according to the invention.

Referring to FIG. 3, the charged BOX layer 2 typically comprises ions such as chlorine or fluorine.

If the BOX layer 2 is intended to be positively charged, it comprises ions such as boron or phosphor.

Provided that the process targets a full activation of the ions, the density of ions is similar to the density of charges.

The ions can be spread uniformly within the BOX layer.

Alternatively, they can be concentrated around a determined depth inside the BOX layer.

The ions can be implanted in the insulating layer after forming the SeOI substrate (through the top layer 3), or before the bonding of the donor wafer and the base wafer.

During the implantation step, ions are implanted inside the insulating layer. The skilled person is able to adjust the parameters of implantation (namely dose and energy of the ions) in order to obtain an implantation profile with a maximum concentration at a determined depth, inside the insulating layer.

Implant energies can be in the range of 1 keV to 300 keV, for example, 10 keV-100 keV, and the dose can be in the range of $10^{13}$ to $10^{17}$ atoms/cm$^2$.

Typically, one type of species is implanted, but more than one can be used if specific chemical compounds are needed.

Alternatively, a plasma treatment can be carried out on the insulating layer 2 before bonding the donor wafer 4 (FIG. 2) and the base wafer 1.

The conditions of such a plasma treatment are typically: a power between 300 W and 1 kW, for instance 535 W, a pressure between 10 and 500 mT, typically about 50 mT, a flow from 100 sccm to 300 sccm, preferably about 200 sccm, a temperature of between 23° C. and 30° C., preferably 27° C., and a process time from 3 seconds to 60 seconds, typically about 30 seconds.

Alternatively, electron bombardment of the layer 2, in the configuration where it is a surface layer of a wafer, directly before bonding, can impart negative charge to this layer 2.

SECOND EMBODIMENT

The Charged Zone Is a Charge-Confining Layer Between Diffusion Barrier Layer(s)

Figure 4:
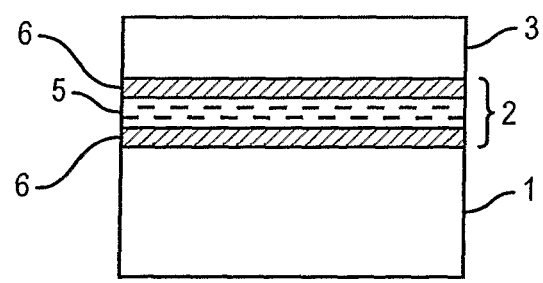
FIG. 4 illustrates a second embodiment.
Figure 5:
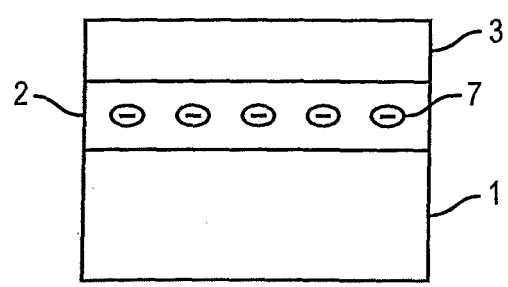
FIG. 5 illustrates a third embodiment of the invention.

In reference to FIG. 4, the SeOI substrate can advantageously comprise an insulating layer 2 comprised of a charge-confining layer 5, confined on one or both sides with diffusion barrier layers 6 made of a material that is able to prevent the diffusion of ions or charges within the substrate.

To prevent diffusion and hence dissipation of the charge, both top and bottom barrier layers 6 are needed.

For instance, a charge-confining layer 5 made of silicon oxide is between two barrier layers 6 made of silicon nitride. This configuration is particularly useful when the negative ions are fluorine, which diffuse in SiO$_2$.

Alternatively, the charge-confining layer 5 may be made of silicon nitride and the barrier layers 6 are made of silicon oxide.

This structure can be made by constructing the charge-confining layer 5, and barrier layers 6, prior to bonding, on either donor wafer 4 (FIG. 2) or base wafer 1.

The insulating layer 2 can be constructed fully on one wafer before bonding, by depositing successively a first barrier layer 6, the charge-confining layer 5, and a second barrier layer 6.

Alternatively, a first barrier layer 6 and the charge-confining layer 5 can be deposited on one of the wafers, the second barrier layer 6 being deposited on the other wafer. The wafers are then bonded with the charge-confining layer 5 at an interface.

The implication of either arrangement is the use of oxide-to-silicon bonding versus oxide-to-oxide bonding.

The barrier layers 6 can be made by thin film deposition such as LPCVD or PECVD with thicknesses in the range of 10 angstroms to 500 angstroms.

The charge-confining layer 5 is preferably formed, prior to bonding, by plasma activation of a layer deposited on a barrier layer.

Alternatively, the charge-confining layer 5 can be formed by depositing a doped layer of oxide or nitride on a wafer having a deposited insulating layer (namely the first barrier layer 6), by a technique such as LPCVD (low pressure chemical vapor deposition), or PECVD (plasma enhanced chemical vapor deposition), prior to bonding to a second wafer with a top insulating layer (namely the second barrier layer 6).

The charged doped layer 5 is thus embedded in the two insulating layers 6.

The dopant is chosen among boron, phosphor, chlorine and fluorine, with a dopant concentration higher than $10^{10}$/cm$^2$, for example, higher than $10^{11}$/cm$^2$.

The thickness of the charge-confining layer 5 can be on the order of 10 angstroms to 1000 angstroms.

The stack 6, 5, 6 of FIG. 4 is also known as "ONO" ("Oxide-Nitride-Oxide"). It is, for instance, used in a certain type of 1T memory, named "SOONO" (Silicon-On-ONO), and also in non-volatile Flash memories; however, in this case this stack is not a buried insulating layer but is a floating-gate insulating layer and it is not charged.

THIRD EMBODIMENT

The Charged Zone Consists of Embedded Charge-Trapping Islands

As compared to the second embodiment where the charge is uniformly distributed in the charge-confining layer 5, in this third embodiment, the charge is localized in islands 7 embedded in the insulating layer 2. This configuration is shown in FIG. 4.

The islands 7 can be formed by implantation of the desired ion, such as chlorine or fluorine, into the insulating layer 2 with some critical dose that may be followed by an anneal during which precipitation and formation of nuclei of the Si—F (for example) phase is formed.

This implantation step can be carried out before or after bonding, and implies the same doses as in the first embodiment.

Alternatively, silicon can be implanted in an insulating layer made of SiO$_2$ or Si$_3$N$_4$, thus forming charge-trapping islands 7 made of silicon.

Also, growth of a doped charge layer followed by annealing is more suitable due to control of dopant concentration directly through thin film deposition.

If the islands 7 are not charged while they are formed, they can be charged later. For example, it is possible to inject electrons in the islands 7, either by applying a high voltage to the structure or bombarding it with electrons.

Another possibility is to implant ions in the islands 7.

FOURTH EMBODIMENT

Ferroelectric Material

According to a fourth embodiment of the invention, the insulating layer of the SeOI substrate comprises a ferroelectric material, such as oxides of lead and zirconium and/or titanium Pb(Zr$_x$,Ti$_{1-x}$)O$_3$ with x between 0 and 1.

Alternatively, the insulating layer is made of a stack of such ferroelectric materials.

Indeed, ferroelectric materials have the property of exhibiting a spontaneous dipole moment and, hence, to create a permanent electric field in the substrate.

The electric field must be oriented such as to accumulate holes at the interface between the insulating layer and the top layer.

FIFTH EMBODIMENT

Electrically Active Defects in the Insulating Layer

Another possibility is to create electrically active defects in or at the insulating layer, for instance, defects resulting in a charge density of interface traps (DITs) between the insulating layer and the adjacent layer.

Following the fabrication of the structure of the substrate, additional electrical charge may be injected into the insulating layer—for instance, by implantation, or by applying an electrical field by means of electrode plates put into close contact with the substrate. The charge may thus be trapped by the atomic species, which become ions according to the above example. Such charge injection may, for instance, be applied in order to tune the charge level.

In principle, such an SeOI substrate is expected to have a permanent density of charges during the whole life duration of the FBC memory.

However, it must be noted that, depending on the techniques used, the charges in the insulating layer might be dissipated, for example, during the fabrication of the transistor on the SeOI substrate.

Indeed, the fabrication process involves thermal treatments at higher temperatures—typically at 600° C. or greater—such that the charges are dissipated.

In such a case also, charge injection as described above may be used for tuning the charge level and, for example, restoring the initial charge level.

For example, the atomic species that had been implanted into the insulating layer may become neutral, but remain in the insulating layer.

The insulating layer thus keeps a feature (i.e., the presence of atomic species) that distinguishes it from the known SeOI substrates, and is able to be charged again, after the fabrication of the transistor.

The SeOI substrate with a charged insulating layer that has been described above can be used for making a 1TRAM memory. To that end, the source and drain of the transistor are made in the top semiconductor layer, whereas the gate is deposited on an insulating layer on the top semiconductor layer.

If necessary, i.e., if the charges of the insulating layer have been dissipating during the fabrication of the transistor, a step of charging again the insulating layer can be carried out.

This 1T device then comprises an insulating layer whose density of charges is substantially permanent during the whole lifetime of the device.

Also, the charged insulating layer and the SeOI substrate are generally provided before the devices are formed in the top layer, but it is also possible, for instance, in the case of 3D integration of devices, to first form the device in an initial substrate and then form the SeOI substrate of the invention by transferring a top portion of this initial substrate onto a base wafer, with the charged insulating layer being positioned in between.

The SeOI substrate with a charged insulating layer that has been described above can also be used for other type of applications, like, for instance, as a substrate for receiving or comprising image sensor devices. As mentioned in U.S. Pat. No. 5,227,313, for such an application it is usual to dope, for instance, with boron, the top layer of a SeOI substrate in order to form electrical potential that will drive the photogenerated charges toward the sensor itself. But the formation of appropriate boron concentration profile across the thickness of the top layer could be problematic. For instance, it should be taken into account diffusion of the dopant that will occur during the sensor devices' manufacturing steps that involve exposure of the substrate to relatively high temperatures. This problem could be advantageously solved by replacing the boron doping, or completing a reduced boron doping of the top layer by the charged insulating layer according to the invention. In that case, the type of charge would be selected to drive away the photogenerated charges from the top layer/insulating layer interface toward the active elements of the image sensor devices. In "backside lighting" applications, the base wafer of the SeOI substrate could be selected to be transparent (e.g., made of glass or quartz); or it can be eliminated after the formation of the sensor devices, as described in U.S. Pat. No. 5,244,817.

The invention claimed is:

1. A method of manufacturing a substrate, comprising:
   forming an insulating layer on one of a base wafer and a donor wafer;
   providing a top semiconductor layer over the insulating layer on a side thereof opposite the one of the base wafer and the donor wafer;
   charging at least a zone of the insulating layer to a density of charges in absolute value higher than $10^{10}$ charges/$cm^2$; and
   bonding the base wafer and the donor wafer together subsequent to charging at least the zone of the insulating layer, the insulating layer at an interface between the base wafer and the donor wafer.

2. The method of claim 1, wherein charging at least a zone of the insulating layer comprises doping the insulating layer.

3. The method of claim 1, wherein charging at least a zone of the insulating layer comprises implanting ions in the insulating layer through the top semiconductor layer.

4. The method of claim 1, wherein charging at least a zone of the insulating layer comprises bombarding the insulating layer with electrons.

5. The method of claim 1, wherein charging at least a zone of the insulating layer comprises treating the insulating layer with plasma.

6. The method of claim 1, wherein forming an insulating layer comprises:
   forming a first diffusion barrier layer;
   forming a charge-confining layer; and
   forming a second diffusion barrier layer.

7. The method of claim 6, wherein charging at least a zone of the insulating layer comprises activating the charge-confining layer using plasma.

8. The method of claim 6, wherein charging at least a zone of the insulating layer comprises:
   selecting a dopant from the group consisting of boron, phosphor, chlorine, and fluorine; and
   growing a doped charge-confining layer comprising the dopant at a concentration of greater than $10^{10}/cm^2$.

9. The method of claim 6, further comprising:
   forming the charge-confining layer to comprise silicon nitride; and
   forming the first diffusion barrier layer and the second diffusion barrier layer to comprise silicon oxide.

10. The method of claim 1, further comprising forming charge-trapping islands in the insulating layer prior to bonding the base wafer and the donor wafer together.

11. The method of claim 10, further comprising forming the charge-trapping islands to comprise silicon.

* * * * *

UNITED STATES PATENT AND TRADEMARK OFFICE
CERTIFICATE OF CORRECTION

PATENT NO.        : 8,535,996 B2                                              Page 1 of 1
APPLICATION NO.   : 12/865838
DATED             : September 17, 2013
INVENTOR(S)       : Shaheen et al.

It is certified that error appears in the above-identified patent and that said Letters Patent is hereby corrected as shown below:

On the title page:
ITEM [75] sixth Inventor        change "Karin Landry," to --Karine Landry,--

Signed and Sealed this
Third Day of February, 2015

Michelle K. Lee
*Deputy Director of the United States Patent and Trademark Office*